(12) United States Patent
Tsai et al.

(10) Patent No.: US 12,348,214 B2
(45) Date of Patent: Jul. 1, 2025

(54) SURFACE ACOUSTIC WAVE DEVICE AND METHOD FOR FABRICATING THE SAME

(71) Applicant: UNITED MICROELECTRONICS CORP., Hsin-Chu (TW)

(72) Inventors: Shih-Hung Tsai, Tainan (TW); Hon-Huei Liu, Kaohsiung (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 966 days.

(21) Appl. No.: 17/393,384

(22) Filed: Aug. 3, 2021

(65) Prior Publication Data

US 2023/0009805 A1 Jan. 12, 2023

(30) Foreign Application Priority Data

Jul. 8, 2021 (CN) .......................... 202110771313.7

(51) Int. Cl.
*H03H 9/05* (2006.01)
*H03H 3/08* (2006.01)
*H03H 9/02* (2006.01)

(52) U.S. Cl.
CPC .............. *H03H 9/059* (2013.01); *H03H 3/08* (2013.01); *H03H 9/02559* (2013.01)

(58) Field of Classification Search
CPC ........... H03H 9/02275; H03H 9/02653; H03H 9/02661; H03H 9/02559; H03H 9/059
See application file for complete search history.

(56) References Cited

U.S. PATENT DOCUMENTS

| 6,583,690 | B2 | 6/2003 | Lee et al. | |
|---|---|---|---|---|
| 8,802,538 | B1 | 8/2014 | Liu et al. | |
| 10,305,443 | B2 * | 5/2019 | Bhattacharjee | ........ H03H 9/145 |
| 2004/0233017 | A1 | 11/2004 | Iwashita et al. | |
| 2014/0203893 | A1 * | 7/2014 | Kando | ............... H03H 9/02574 |
| | | | | 333/187 |
| 2022/0200566 | A1 * | 6/2022 | Kadota | .............. H03H 9/02834 |

FOREIGN PATENT DOCUMENTS

| CN | 112653407 A | * | 4/2021 | |
|---|---|---|---|---|
| WO | 2013172251 | | 11/2013 | |
| WO | WO-2014054580 A1 | * | 4/2014 | ......... H03H 9/02559 |
| WO | 2020/204045 A1 | | 10/2020 | |

* cited by examiner

*Primary Examiner* — J. San Martin
(74) *Attorney, Agent, or Firm* — Winston Hsu

(57) ABSTRACT

A method for fabricating a surface acoustic wave (SAW) device includes the steps of forming a first dielectric layer on a substrate, forming a piezoelectric layer on the first dielectric layer, forming a second dielectric layer on the piezoelectric layer, performing a photo-etching process to remove the second dielectric layer for forming a recess in the second dielectric layer, forming a metal layer in the recess, and then performing a planarizing process to remove the metal layer for forming an electrode in the recess.

4 Claims, 4 Drawing Sheets

SURFACE ACOUSTIC WAVE DEVICE AND METHOD FOR FABRICATING THE SAME

BACKGROUND OF THE INVENTION

1. Field of the Invention

The invention relates to a surface acoustic wave (SAW) device and method for fabricating the same, and more particularly, to a SAW device adaptable for hybrid bonding package and method for fabricating the same.

2. Description of the Prior Art

In recent years, volume of communication has increased dramatically in the mobile communication industry primarily represented by mobile phones. To satisfy this immense needs, market has to increase the number of communication channels and various components such SAW devices need to be miniaturized for reaching high performance. Typically, SAW device are made of piezoelectric materials such as lithium niobate ($LiNbO_3$) or lithium tantalite ($LiTaO_3$) and since these materials have larger electromechanical coupling coefficient, wide band could be reached for the device.

Nevertheless in current mobile communication devices such as mobile phones, it is often necessary to reduce the size of application specific integrated circuit (ASIC) chips in order to save inner space. Hence, how to effectively integrate SAW devices to hybrid bond packages have become an important task in this field.

SUMMARY OF THE INVENTION

According to an embodiment of the present invention, a method for fabricating a surface acoustic wave (SAW) device includes the steps of forming a first dielectric layer on a substrate, forming a piezoelectric layer on the first dielectric layer, forming a second dielectric layer on the piezoelectric layer, performing a photo-etching process to remove the second dielectric layer for forming a recess in the second dielectric layer, forming a metal layer in the recess, and then performing a planarizing process to remove the metal layer for forming an electrode in the recess.

According to another aspect of the present invention, a method for fabricating a surface acoustic wave (SAW) device includes the steps of forming a first dielectric layer on a substrate, forming a piezoelectric layer on the dielectric layer, forming an electrode on the piezoelectric layer, and forming a second dielectric layer around the electrode.

According to yet another aspect of the present invention, a surface acoustic wave (SAW) device includes a dielectric layer on a substrate, a piezoelectric layer on the dielectric layer, and an electrode on the piezoelectric layer. Preferably, top surfaces of the electrode and the piezoelectric layer are coplanar.

According to yet another aspect of the present invention, a surface acoustic wave (SAW) device includes a first dielectric layer on a substrate, a piezoelectric layer on the first dielectric layer, an electrode on the piezoelectric layer, and a second dielectric layer around the electrode. Preferably, top surfaces of the electrode and the second dielectric layer are coplanar.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
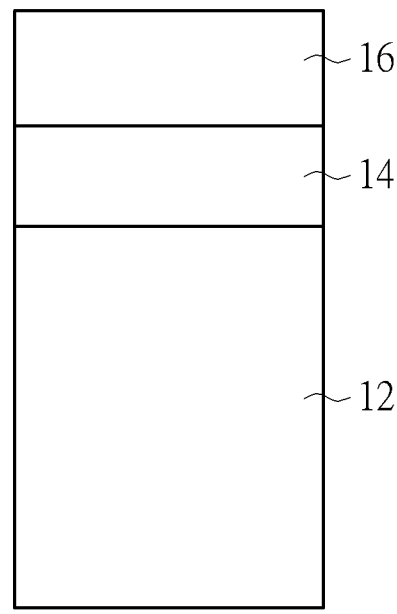
FIGS. 1-3 illustrate a method for fabricating a SAW device according to an embodiment of the present invention.
Figure 2:
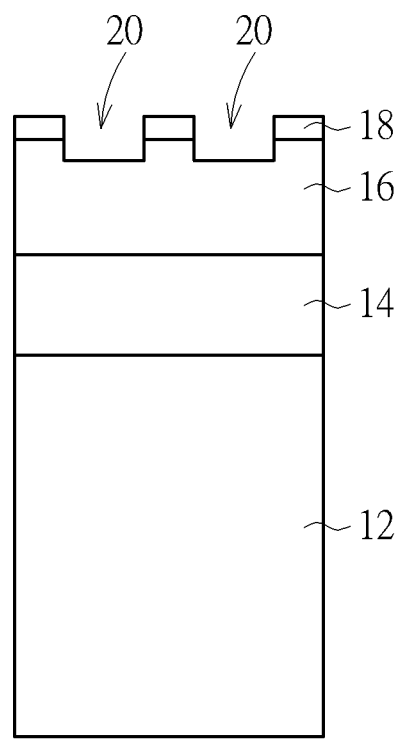
Figure 3:
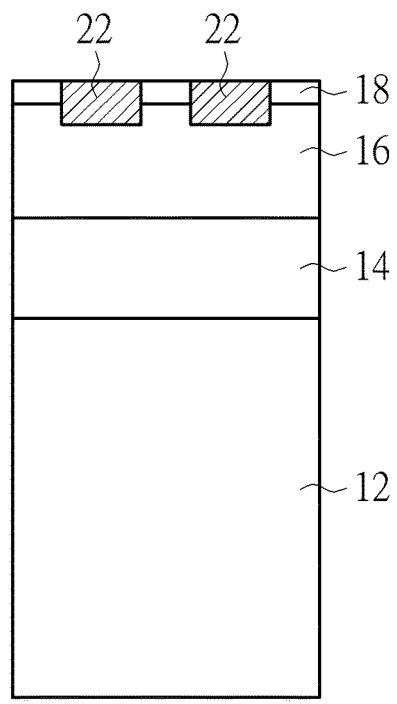

Referring to FIGS. 1-3, FIGS. 1-3 illustrate a method for fabricating a SAW device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). Next, a first dielectric layer 14 is formed on the surface of the substrate 12, and a piezoelectric layer 16 is formed on the first dielectric layer 14. In this embodiment, the first dielectric layer 14 preferably includes dielectric material including but not limited to for example silicon oxide and the piezoelectric layer 16 preferably includes lithium niobate ($LiNbO_3$) or lithium tantalite ($LiTaO_3$).

Next, as shown in FIG. 2, a second dielectric layer 18 is formed on the surface of the piezoelectric layer 16, and a photo-etching process is conducted to remove the second dielectric layer 18 to form at least a recess such as recesses 20 in the second dielectric layer 18. Specifically, the formation of the recesses 20 in this stage could be accomplished by first forming a patterned mask (not shown) such as a patterned resist on the surface of the second dielectric layer 18 and then conducting an etching process by using the patterned mask as mask and using nitric acid or benzoic acid as etching agent to remove part of the second dielectric layer 18 and part of the piezoelectric layer 16 for forming one or more recesses 20 in the second dielectric layer 18 and piezoelectric layer 16. It should be noted that the recesses 20 formed at this stage is formed into the second dielectric layer 18 and part of the piezoelectric layer 16 so that the bottom surface of the recesses 20 is slightly lower than the top surface of the piezoelectric layer 16.

Next, as shown in FIG. 3, a metal layer is formed on the second dielectric layer 18 to fill the recesses 20 for forming a plurality of electrodes 22 in the recesses 20. In this embodiment, the formation of the electrodes 22 could be accomplished by first conducting a deposition process such as chemical vapor deposition (CVD) process to form a metal layer on the surface of the second dielectric layer 18 and into the recesses 20, and then conducting a planarizing process such as chemical mechanical polishing (CMP) process to remove part of the metal layer so that the top surfaces of the remaining metal layer and the second dielectric layer 18 are coplanar to form the electrodes 22. In this embodiment, the metal layer or the electrodes 22 are composed of conductive or metal material including copper, aluminum, gold, or combination thereof. Next, back end of the line (BEOL) process and hybrid bonding process could be conducted by forming an inter-metal dielectric (IMD) layer on the electrodes 22 and the second dielectric layer 18 and metal interconnections in the IMD layer to electrically connect the electrodes 22, and then bonding the metal interconnections with other ASIC chips depending on the demand of the product. This completes the fabrication of a SAW device according to an embodiment of the present invention.

Figure 4:
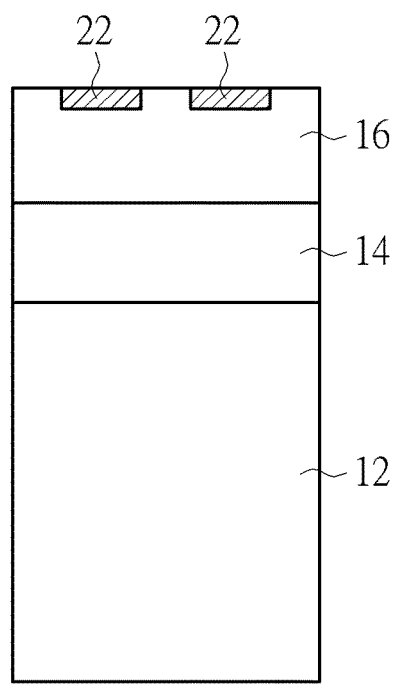
FIG. 4 illustrates a structural view of a SAW device according to an embodiment of the present invention.

Referring to FIG. 4, FIG. 4 illustrates a structural view of a SAW device according to an embodiment of the present invention. As shown in FIG. 4, in contrast to the aforementioned embodiment of directly forming metal interconnections to electrically connect the electrodes 22 and ASIC chips without removing the second dielectric layer 18, according to another embodiment of the present invention, it would also be desirable to form the electrodes 22 and then conduct another planarizing process such as a non-selective etching process to remove part of the electrodes 22 and all of the second dielectric layer 18 to expose the piezoelectric layer 16 underneath so that the top surfaces of the remaining electrodes 22 and the piezoelectric layer 16 are coplanar. Since the electrodes 22 are embedded within the piezoelectric layer 16 the bottom surface of the electrodes 22 is lower than the top surface of the piezoelectric layer 16. Preferably, the non-selective etching process could include the utilization of carbon-containing or fluorine-containing gases including but not limited to for example carbon tetrachloride ($CF_4$) or hexafluoroethane ($C_2F_6$).

Figure 5:
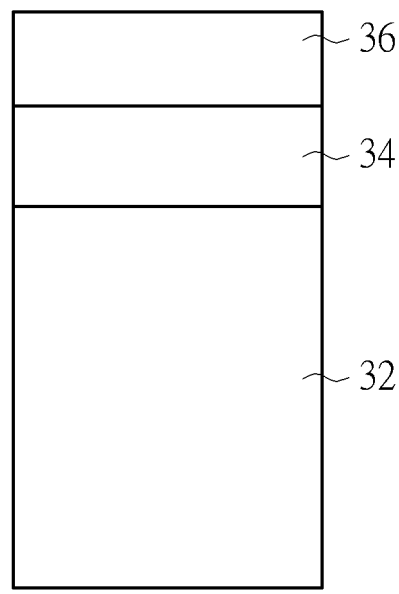
FIGS. 5-7 illustrate a method for fabricating a SAW device according to an embodiment of the present invention.
Figure 6:
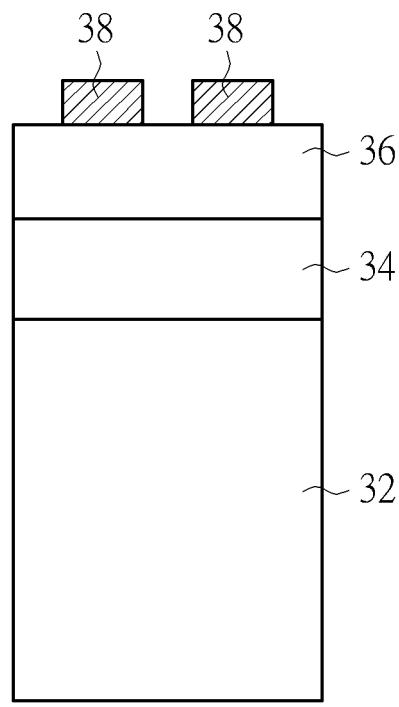
Figure 7:
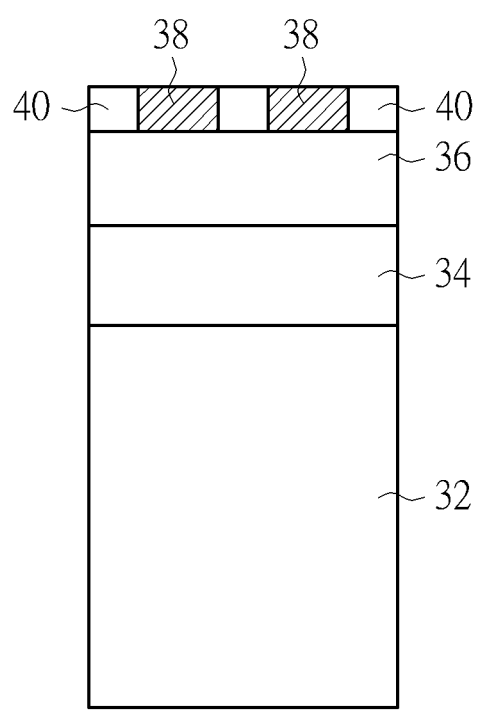

Referring to FIGS. 5-7, FIGS. 5-7 illustrate a method for fabricating a SAW device according to an embodiment of the present invention. As shown in FIG. 5, a substrate 32 made of semiconductor material is first provided, in which the semiconductor material could be selected from the group consisting of silicon (Si), germanium (Ge), Si—Ge compounds, silicon carbide (SiC), and gallium arsenide (GaAs). Next, a first dielectric layer 34 is formed on the surface of the substrate 32, and a piezoelectric layer 36 is formed on the first dielectric layer 34. In this embodiment, the first dielectric layer 34 preferably includes dielectric material including but not limited to for example silicon oxide and the piezoelectric layer 36 preferably includes lithium niobate ($LiNbO_3$) or lithium tantalite ($LiTaO_3$).

Next, as shown in FIG. 6, a plurality of electrodes 38 are formed on the surface of the piezoelectric layer 36. In this embodiment, the formation of the electrodes 38 could be accomplished by first performing a deposition process such as chemical vapor deposition (CVD) process to form a metal layer (not shown) on the surface of the piezoelectric layer 36, and then conducting a pattern transfer or photo-etching process by using a patterned mask such as patterned resist to pattern or remove part of the metal layer so that the remaining metal layer forms the electrodes 38 on the surface of the piezoelectric layer 36. Structurally, the plurality of electrodes 38 formed at this stage are protruding above the surface of the piezoelectric layer 36 and similar to the aforementioned embodiment, the metal layer or the electrodes 38 are made of conductive or metal material including copper, aluminum, gold, or combination thereof.

Next, as shown in FIG. 7, a second dielectric layer 40 is formed on the piezoelectric layer 36 and surrounding the electrodes 38. Preferably, the formation of the second dielectric layer 40 could be accomplished by first performing a deposition process to form a second dielectric layer 40 made of silicon oxycarbide (SiOC) on the piezoelectric layer 36 and the electrodes 38, and then conducting a planarizing process such as CMP process to remove part of the second dielectric layer 40 so that the remaining second dielectric layer 40 fills the space between the electrodes 38 and the top surfaces of the remaining second dielectric layer 40 and the electrodes 38 are coplanar and the bottom surfaces of the second dielectric layer 40 and the electrodes 38 are also coplanar.

Overall, the present invention discloses two types of methods for fabricating a SAW device, in which a first approach could be accomplished by sequentially forming a first dielectric layer, a piezoelectric layer, and a second dielectric layer on the substrate, and forming recesses in the second dielectric layer and the piezoelectric layer, and then depositing metal material into the recesses to serve as electrodes. Another approach for fabricating the SAW device could be accomplished by sequentially forming a first dielectric layer and a piezoelectric layer on the substrate, forming at least an electrode or electrodes on the piezoelectric layer, and then forming a second dielectric layer around the electrodes. In contrast to current SAW device having electrodes protruding above the surface of piezoelectric layer while no other dielectric layer are disposed around the electrodes, it would be desirable to employ the aforementioned two approaches to integrate the SAW device to hybrid bonding process for improving overall performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A surface acoustic wave (SAW) device, comprising:
 a first dielectric layer on a substrate;
 a piezoelectric layer on the first dielectric layer; and
 an electrode on the piezoelectric layer, and
 a second dielectric layer on the piezoelectric layer, wherein the second dielectric layer surrounds side surfaces of the electrode,
 wherein top surfaces of the electrode and the second dielectric layer are coplanar.

2. The SAW device of claim 1, wherein a bottom surface of the electrode is lower than a top surface of the piezoelectric layer.

3. The SAW device of claim 1, wherein the first dielectric layer comprises silicon oxide.

4. The SAW device of claim 1, wherein the piezoelectric layer comprises $LiNbO_3$ or $LiTaO_3$.

* * * * *